(12) United States Patent
Chiang et al.

(10) Patent No.: US 9,323,883 B2
(45) Date of Patent: Apr. 26, 2016

(54) PLANAR DESIGN TO NON-PLANAR DESIGN CONVERSION METHOD

(71) Applicant: UNITED MICROELECTRONICS CORP., Hsin-Chu (TW)

(72) Inventors: Chao-Yao Chiang, Hsinchu (TW); Kuo-Hsun Huang, Taichung (TW); Chien-Hung Chen, Taipei (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 29 days.

(21) Appl. No.: 14/337,187

(22) Filed: Jul. 21, 2014

(65) Prior Publication Data

US 2015/0356231 A1  Dec. 10, 2015

(30) Foreign Application Priority Data

Jun. 4, 2014 (TW) .............................. 103119425 A

(51) Int. Cl.
*G06F 17/50* (2006.01)

(52) U.S. Cl.
CPC ........ *G06F 17/5081* (2013.01); *G06F 17/5068* (2013.01)

(58) Field of Classification Search
CPC .................................................. G06F 17/5072
USPC .......................................................... 716/53
See application file for complete search history.

(56) References Cited

U.S. PATENT DOCUMENTS

| | | | |
|---|---|---|---|
| 8,286,114 B2 | 10/2012 | Chuang et al. | |
| 8,533,651 B1 | 9/2013 | Tan et al. | |
| 8,621,406 B2 | 12/2013 | Lei et al. | |
| 8,631,382 B2 | 1/2014 | Wang et al. | |
| 8,832,620 B1 * | 9/2014 | Fried et al. | 716/110 |
| 9,158,886 B1 * | 10/2015 | Chen | |
| 2005/0095852 A1 * | 5/2005 | Saenger et al. | 438/672 |
| 2005/0136582 A1 * | 6/2005 | Aller et al. | 438/197 |
| 2008/0263492 A1 * | 10/2008 | Chuang et al. | 716/10 |
| 2009/0121291 A1 * | 5/2009 | Anderson et al. | 257/365 |
| 2012/0273899 A1 | 11/2012 | Wann et al. | |
| 2012/0278776 A1 | 11/2012 | Lei et al. | |
| 2012/0278777 A1 | 11/2012 | Lin et al. | |
| 2012/0278781 A1 | 11/2012 | Wann et al. | |
| 2013/0275935 A1 | 10/2013 | Rashed et al. | |
| 2014/0008732 A1 * | 1/2014 | Hyvonen et al. | 257/390 |
| 2014/0084387 A1 * | 3/2014 | Dewey et al. | 257/410 |
| 2014/0170998 A1 * | 6/2014 | Then et al. | 455/127.2 |
| 2014/0175515 A1 * | 6/2014 | Then et al. | 257/194 |
| 2014/0282324 A1 * | 9/2014 | Greiner et al. | 716/111 |
| 2014/0285980 A1 * | 9/2014 | Cappellani et al. | 361/748 |
| 2015/0093910 A1 * | 4/2015 | Tan et al. | 438/761 |

\* cited by examiner

*Primary Examiner* — Suchin Parihar
(74) *Attorney, Agent, or Firm* — Winston Hsu; Scott Margo

(57) ABSTRACT

A planar design to non-planar design conversion method includes following steps. At least a diffusion region pattern including a first side and a second side perpendicular to each other is received. A look-up table is queried to obtain a first positive integer according to the first side of the diffusion region pattern and a second positive integer according to the second side of the diffusion region pattern. Then, a plurality of fin patterns is formed. An amount of the fin patterns is equal to the second positive integer. The fin patterns respectively include a first fin length, and the first fin length is a product of the first positive integer and a predetermined value. The forming is performed by at least a computer-aided design (CAD) tool.

14 Claims, 5 Drawing Sheets

PLANAR DESIGN TO NON-PLANAR DESIGN CONVERSION METHOD

BACKGROUND OF THE INVENTION

1. Field of the Invention

The present invention relates to a planar design to non-planar design conversion method, and more particularly, to a planar semiconductor device design to non-planar semiconductor device design conversion method.

2. Description of the Prior Art

Conventional planar metal-oxide-semiconductor (MOS) transistor has difficulty when scaling down to 65 nm and below. Therefore the non-planar transistor technology such as Fin Field effect transistor (FinFET) technology that allows smaller size and higher performance is developed to replace the planar MOS transistor.

Because the three-dimensional FinFET device increases the overlapping area between the gate and the substrate, the channel region is more effectively controlled. This therefore reduces drain-induced barrier lowering (DIBL) effect and short channel effect. In addition, the channel region is longer under the same gate length, and thus the current between the source and the drain is increased.

However, the FinFET device still faces many problems. For example, a planar design to non-planar design conversion method that is able to lower cost and to improve process compatibility is always in need.

SUMMARY OF THE INVENTION

According to an aspect of the present invention, a planar design to non-planar design conversion method is provided. The planar design to non-planar design conversion method includes following steps: At least a diffusion region pattern including a first side and a second side perpendicular to each other is received. A look-up table is queried to obtain a first positive integer according to the first side of the diffusion region pattern and obtain a second positive integer according to the second side of the diffusion region pattern. Then, a plurality of fin patterns is formed. An amount of the fin patterns is equal to the second positive integer. The fin patterns respectively include a first fin length, and the first fin length is a product of the first positive integer and a predetermined value. The forming is performed by at least a computer-aided design (hereinafter abbreviated as CAD) tool.

According to the planar design to non-planar design conversion method of the present invention, the look-up table is provided and queried to obtain the amount of the fin patterns and the first fin length of the fin patterns according to the lengths of the first side and the second side of the diffusion region pattern. Furthermore, the fin patterns can be formed in the CAD tool directly after obtaining the first fin length or after performing an optical proximity correction (hereinafter abbreviated as OPC) method. Accordingly, the planar design is converted to the non-planar design by the planar design to non-planar design conversion method provided by the present invention. Particularly speaking, the diffusion regions of the planar design are efficaciously and precisely converted to fin structures of the non-planar design by the planar design to non-planar design conversion method of the present invention. Consequently, process cost is reduced and the convertibility of planar design to non-planar design is improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3, 5 and 6 are schematic drawings illustrating a planar design to non-planar design conversion method provided by a second preferred embodiment of the present invention.

FIGS. 3, 7 and 8 are schematic drawings illustrating a planar design to non-planar design conversion method provided by a second preferred embodiment of the present invention.

DETAILED DESCRIPTION

Typically speaking, an integrated circuit design flow can be summarized as: an idea is produced and realized in a CAD tool, which is also known as an electronic design automation (EDA). When the design is finalized, the fabrication process and packaging and assembly processes are performed and ultimately resulting in finished integrated circuit chips.

Figure 1:
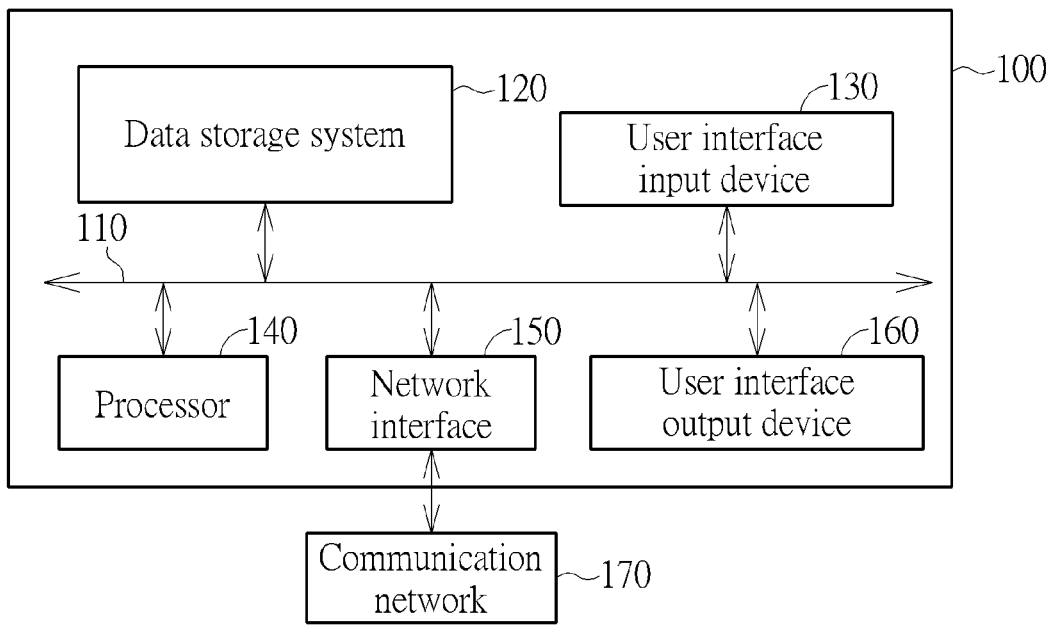
FIG. 1 illustrates a computer system suitable for use with embodiments of the present invention.

Please refer to FIG. 1, which illustrates a computer system suitable for use with embodiments of the present invention. The computer system 100 includes a system bus 110, a data storage system 120, a user interface input device 130, a processor 140, a network interface 150, and a user interface output device 160. The data storage system 120 provides persistent storage for program and data files. In the present invention, the data storage system 120 provides one or more CAD tool functions. The user interface input device 130 and the user interface output device 160 includes all possible types of device and ways to input/output information into or from the computer system 100. The network interface 150 serves as an interface to outside networks and is coupled to corresponding interface devices in other computer systems via a communication network 170. Additionally, the computer system 100 itself can be of varying types including a personal computer, a portable computer, a workstation, a computer terminal, a network computer or user device. The computer system 100 is exemplarily shown in FIG. 1, and those skilled in the art would easily realize that the computer system 100 can include other components or elements.

Figure 2:
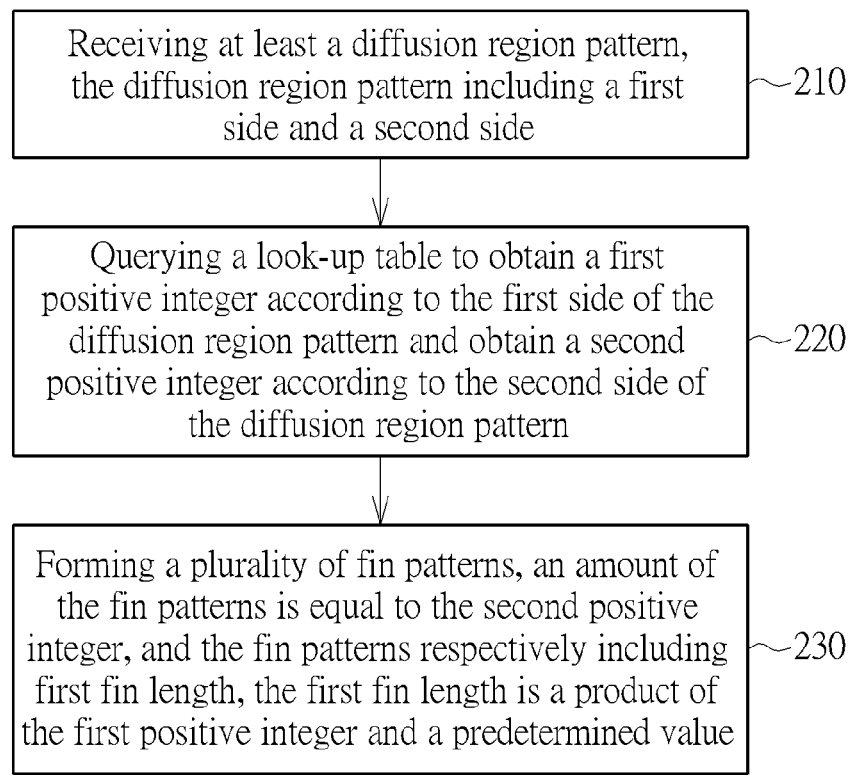
FIG. 2 is a flow chart illustrating a planar design to non-planar design conversion method provided by the present invention.

Please refer to FIG. 2, which is a flow chart illustrating a planar design to non-planar design conversion method 200 provided by the present invention. The planar design to non-planar design conversion method 200 provided by the present invention includes following steps:

Step 210: receiving at least a diffusion region pattern, the diffusion region pattern including a first side and a second side According to the planar design to non-planar design conversion method 200 provided by the present invention, a layout pattern of a planar semiconductor device design, such as a planar field effect transistor, is received. More particularly, at least a diffusion region patterns (or active region pattern) of the planar semiconductor device is received. The diffusion region pattern includes a first side and a second side, and the first side and the second side are perpendicular to each other. Please note that the relationship between the first side and the second side of the diffusion region pattern is described in the following embodiments and exemplarily shown in the following figures, therefore those details are omitted herein for simplicity.

The planar design to non-planar design conversion method 200 provided by the present invention further includes:

Step 220: querying a look-up table to obtain a first positive integer according to the first side of the diffusion region pattern and obtain a second positive integer according to the second side of the diffusion region pattern Step 230: forming a plurality of fin patterns, an amount of the fin patterns is equal to the second positive integer, and the fin patterns respectively including a first fin length, the first fin length is a product of the first positive integer and a predetermined value It should be noted that Step 210-Step 230 can be performed by at least a CAD tool. That is, the planar design to non-planar design conversion method 200 of the present invention can be performed in the computer system 100 as mentioned above.

Figure 3:
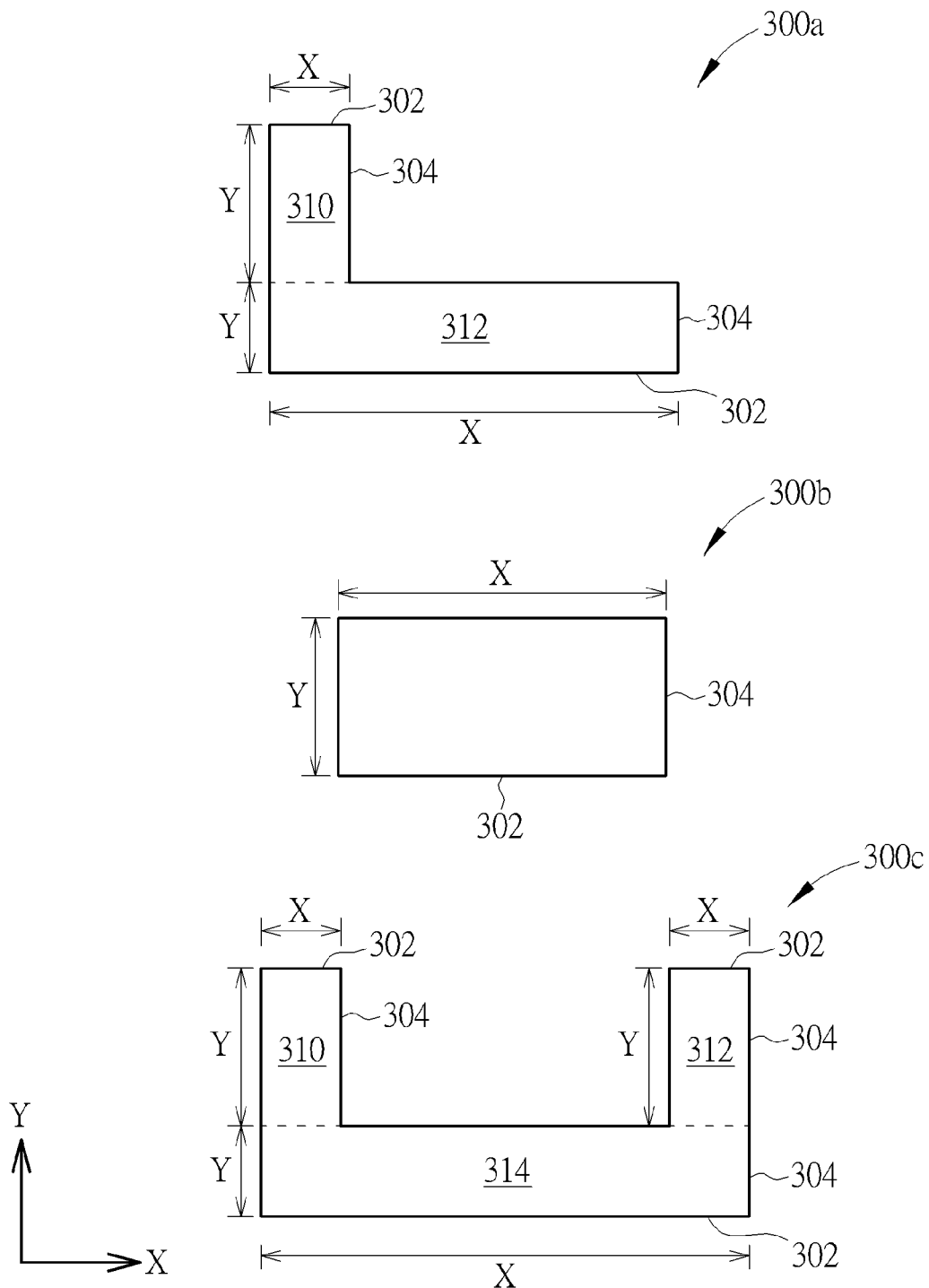
FIGS. 3 and 4 are schematic drawings illustrating a planar design to non-planar design conversion method provided by a first preferred embodiment of the present invention.
Figure 4:
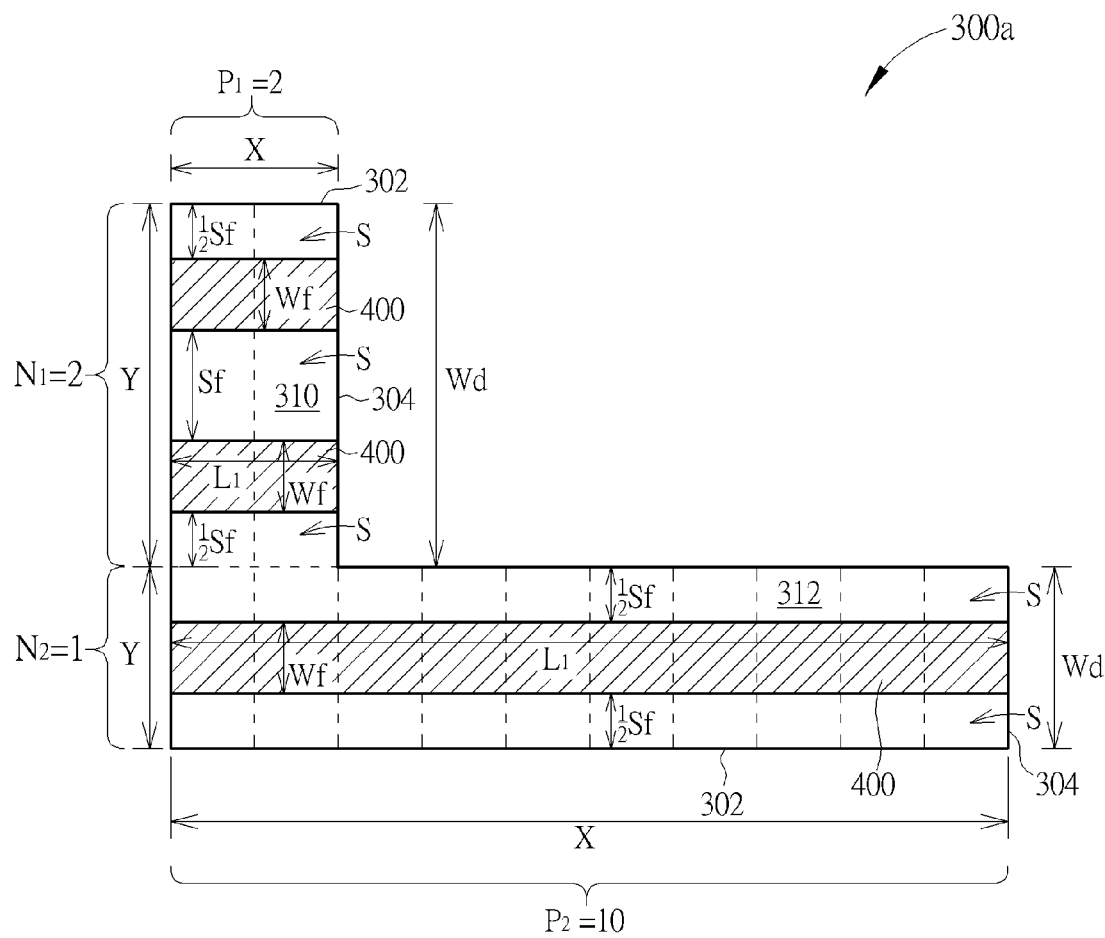

Please refer to FIGS. 3 and 4, which are schematic drawings illustrating a planar design to non-planar design conversion method provided by a first preferred embodiment of the present invention. As shown in FIG. 3, Step 210 is performed to receive at least a diffusion region pattern 300a, 300b, and/or 300c. It is noteworthy that the diffusion region patterns 300a-300c can include different shapes constructed by different blocks. As shown in FIG. 3, the diffusion region pattern 300b includes a quadrilateral shape, more particularly, a rectangle shape. The diffusion region patterns 300a and 300c are not quadrilaterals and thus a dividing step is performed to divide the diffusion region patterns 300a and 300c into a plurality of sub-region patterns 310, 312 and 314. The sub-region patterns 310, 312 and 314 are all include a rectangle shape. In other words, when the diffusion region pattern is not a quadrilateral, the dividing step is introduced to cut and divide the non-quadrilateral patterns into a plurality of rectangular patterns. As shown in FIG. 3, the sub-region patterns 310, 312 and 314 physically contact each other and thus boundaries between the sub-region patterns 310, 312 and 314 are depicted by dotted lines. As shown in FIG. 3, the diffusion region pattern 300b includes a first side 302 and a second side 304. Also, each of the sub-region patterns 310, 312 and 314 of the diffusion region patterns 300a and 300c includes a first side 302 and a second side 304. More important, in each diffusion region pattern 300a-300c and its sub-region patterns 310-314, the side parallel with a X-direction is defined as the first side 302 while the side parallel with a Y-direction is defined as the second side 304. Or, in each diffusion region pattern 300a-300c and its sub-region patterns 310-314, the side perpendicular to a gate extending direction is defined as the first side 302 while the side parallel with the gate extending direction is defined as the second side 304. Consequently, in each diffusion region pattern 300a-300c and its sub-region patterns 310-314, any first side 302 is perpendicular to the second side 304. Furthermore, the first side 302 includes a length X and the second side 304 includes a length Y.

It is noteworthy that the diffusion region pattern 300a is detailed as an embodiment of the planar design to non-planar design conversion method 200 provided by the preferred embodiment, however those skilled in the art still can easily realize the embodiments involving the diffusion region pattern 300b and 300c according to the following description.

Please refer to FIG. 4. Next, Step 220 is performed: querying a look-up table to obtain a first positive integer $P_m$ according to the first side 302 of the diffusion region pattern 300a and obtain a second positive integer $N_n$ according to the second side 304 of the diffusion region pattern 300a. In detail, the diffusion region pattern 300a is constructed by the sub-region pattern 310 and the sub-region pattern 312. The sub-region patterns 310 and 312 respectively include the first side 302 parallel with the X-direction and the second side 304 parallel with the Y-direction. According to the length X of the first side 302 of the sub-region pattern 310, a first positive integer $P_1$ is obtained by querying the look-up table. Also, according to the length Y of the second side 304 of the sub-region pattern 310, a second positive integer $N_1$ is obtained by querying the look-up table. In the same concept, according to the length X of the first side 302 of the sub-region pattern 312, a first positive integer $P_2$ is obtained from the look-up table, and a second positive integer $N_2$ is obtained from the look-up table according to the length Y of the second side 304 of the sub-region pattern 312.

| Look-up table 1 | | | | |
|---|---|---|---|---|
| | $X_1$ | $X_2$ | $X_3$ | ... $X_m$ |
| $Y_1$ | $P_1, N_1$ | $P_2, N_1$ | $P_3, N_1$ | ... $P_{m[max]}, N_1$ |
| $Y_2$ | $P_1, N_2$ | $P_2, N_2$ | $P_3, N_2$ | ... $P_{m[max]}, N_2$ |
| $Y_3$ | $P_1, N_3$ | $P_2, N_3$ | $P_3, N_3$ | $P_{m[max]}, N_3$ |
| $Y_4$ | $P_1, N_4$ | $P_2, N_4$ | $P_3, N_4$ | $P_{m[max]}, N_4$ |
| $Y_5$ | $P_1, N_5$ | $P_2, N_5$ | $P_3, N_5$ | $P_{m[max]}, N_5$ |
| $Y_6$ | $P_1, N_6$ | $P_2, N_6$ | $P_3, N_6$ | $P_{m[max]}, N_6$ |
| ... | ... | ... | ... | ... ... |
| $Y_n$ | $P_1, N_{n[max]}$ | $P_2, N_{n[max]}$ | $P_3, N_{n[max]}$ | ... $P_{m[max]}, N_{n[max]}$ |

After obtaining the first positive integer $P_1/P_2$ and the second positive integer $N_1/N_2$, Step 230 is performed: forming a plurality of fin patterns 400. As shown in FIG. 4, according to the length Y of the second side 304 of the sub-region pattern 310 of the diffusion region pattern 300a, the second positive integer $N_1$ is obtained from the look-up table. In the preferred embodiment, $N_1$ is 2. Consequently, two fin patterns 400 are formed in the sub-region pattern 310. In the same concept, according to the length Y of the second side 304 of the sub-region pattern 312 of the diffusion region pattern 300a, the second positive integer $N_2$ is obtained from the look-up table. In the preferred embodiment, $N_2$ is 1. Consequently, one fin pattern 400 is formed in the sub-region pattern 312.

It is also noteworthy that a plurality of spacing S is formed at two respective sides of the fin pattern 400 as shown in FIG. 4. The fin patterns 400 and the spacings S draw a drawn width Wd. More important, the drawn width Wd is defined by an equation below:

$$Wd = Nf * (Wf + Sf) \quad \text{(equation)}$$

Wherein Wd denotes the drawn width, Nf denotes the amount of the fin patterns, Wf denotes the fin width, and Sf denotes the spacing width. Furthermore, the fin width Wf can be the minimal width obtained by spacer image transfer (SIT) method, and the spacing width Sf is a variable value of the minimum critical dimension. Additionally, as shown in FIG. 4, a distance between the boundary of the sub-region pattern and the fin pattern 400 closest to the boundary is a half of the spacing width Sf between two fin patterns 400.

As mentioned above, the first fin length $L_1$ of the fin patterns 400 is a product of the first positive integer $P_m$ and a predetermined value. The predetermined value can be any unit length defined by the operator. In the preferred embodiment, the predetermined value is the manufacture grid, that is, the minimal width imageable in a graphic software, but not limited to this. According to the length X of the first side 302 of the sub-region pattern 310 of the diffusion region pattern 300a, the first positive integer $P_1$ is obtained from the look-up table. In the preferred embodiment, $P_1$ is 2. Consequently, the first fin length $L_1$ of the fin patterns 400 in the sub-region pattern 310 is two times of the predetermined value. In the same concept, according to the length X of the first side 304 of the sub-region pattern 312 of the diffusion region pattern 300a, the first positive integer $P_2$ is obtained from the look-up table. In the preferred embodiment, $P_2$ is 10. Consequently, the first fin length $L_1$ of the fin patterns 400 in the sub-region pattern 312 is ten times of the predetermined value.

After forming the fin patterns 400 in the sub-region pattern 310 and the sub-region pattern 312, the first fin length $L_1$ of the fin patterns 400 and the diffusion region pattern 300a is verified. In detail, a relationship between the length X of the first side 302 of the sub-region patterns 310/312 and the first fin length $L_1$ is verified: when the first fin length $L_1$ of the fin patterns 400 in the sub-region pattern 310 is equal to the length X of the first side 302 of the sub-region pattern 310, and when the first fin length $L_1$ of the fin patterns 400 in the sub-region pattern 312 is equal to the length X of the first side 302 of the sub-region pattern 312, the planar design to non-planar design conversion is completed. And the fin patterns 400 are outputted into a mask directly after forming the fin patterns 400. In other words, when the length X of the first side 302 of the diffusion region patterns 300a-300c is a positive integer multiple of the predetermined value, a corresponding first positive integer $P_m$ can be directly obtained from the look-up table. Therefore, the first fin length $L_1$ which is the product of the first positive integer $P_m$ and the predetermined value is obtained and the final fin patterns 400 including the first fin length $L_1$ are formed and outputted into the mask. Consequently, the planar design to non-planar design conversion is completed.

According to the planar design to non-planar design conversion method 200 provided by the first preferred embodiment, the amount of the fin patterns 400 and the first fin length $L_1$ of the fin patterns 400 can be directly obtained by querying the look-up table according to the two sides of the diffusion region pattern 300a. And the fin patterns 400 finished in the CAD tool can be outputted into a mask after obtaining the first fin length $L_1$. Accordingly, the planar semiconductor device design is converted into the non-planar semiconductor device design, more particularly, the diffusion regions of the planar semiconductor device design are precisely and efficaciously converted into the fin structures of the non-planar semiconductor device design by the planar design to non-planar design conversion method 200 provided by the present invention.

Figure 5:
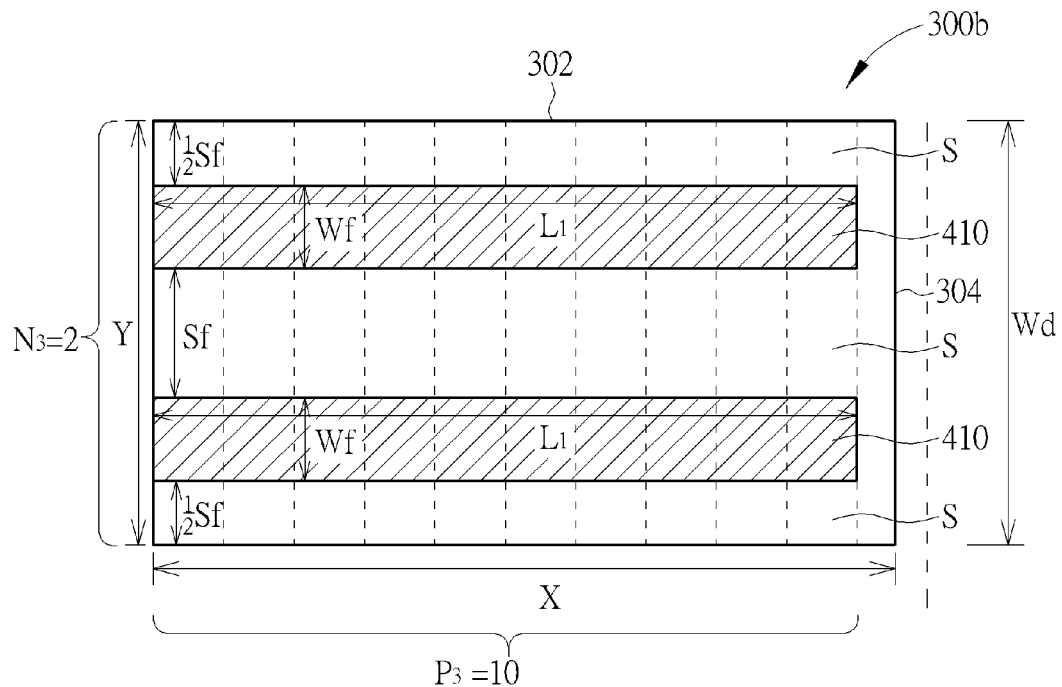
Figure 6:
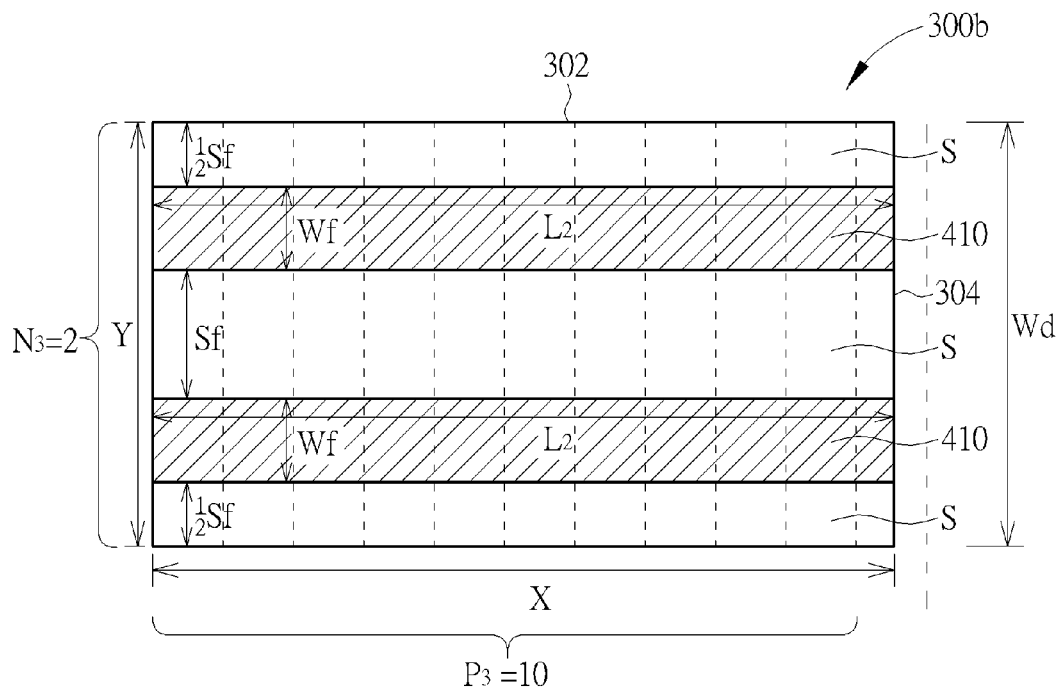

Please refer to FIGS. 3, 5 and 6, which are schematic drawings illustrating a planar design to non-planar design conversion method provided by a second preferred embodiment of the present invention. As shown in FIG. 3, Step 210 is performed to receive at least a diffusion region pattern 300a, 300b, and/or 300c. As mentioned above, the diffusion region patterns 300a-300c can include different shapes constructed by different blocks, but not limited to this. It is noteworthy that though the diffusion region pattern 300b is detailed as an embodiment of the planar design to non-planar design conversion method 200 provided by the preferred embodiment, those skilled in the art still can easily realize the embodiments involving the diffusion region pattern 300a and 300c according to the following description. As shown in FIG. 3, the diffusion region pattern 300b includes a quadrilateral shape, more particularly, a rectangle shape. The diffusion region pattern 300b includes a first side 302 and a second side 304. As mentioned above, the side parallel with the X-direction is defined as the first side 302 while the side parallel with the Y-direction is defined as the second side 304. Or, the side perpendicular to the gate extending direction is defined the first side 302 while the side parallel with the gate extending direction is defined as the second side 304. Consequently, the first side 302 and the second side 304 of the diffusion region pattern 300b are perpendicular to each other. Furthermore, the first side 302 includes a length X, and the second side 304 includes a length Y.

Please refer to FIG. 5. Next, Step 220 is performed: querying a look-up table to obtain a first positive integer $P_m$ according to the first side 302 of the diffusion region pattern 300b and obtain a second positive integer $N_n$ according to the second side 304 of the diffusion region pattern 300b. In detail, according to the length X of the first side 302 of the diffusion region pattern 300b, a first positive integer $P_m$ is obtained by querying the look-up table. Also, according to the length Y of the second side 304 of the diffusion region pattern 300b, a second integer $N_n$ is obtained by querying the look-up table. It is noteworthy that, in the case that the length X cannot be found from the look-up table, there is no positive integer corresponding to the length X of the first side 302 of the diffusion region pattern 300b can be directly obtained. Therefore, a length $X_3$ that is closest to but smaller than the length X is chosen, and thus a first positive integer $P_3$ that is corresponding to $X_3$ is obtained. Also, a second positive integer $N_3$ is obtained from the look-up table according to the length Y of the second side 304 of the diffusion region pattern 300b.

After obtaining the first positive integer $P_3$ and the second positive integer $N_3$, Step 230 is performed: forming a plurality of fin patterns 410. As mentioned above, an amount of the fin patterns 410 is equal to the second positive integer $N_3$. As shown in FIG. 5, according to the length Y of the second side 304 of the diffusion region pattern 300b, a second positive integer $N_3$ is obtained from the look-up table. In the preferred embodiment, $N_3$ is 2. Consequently, two fin patterns 410 are formed in the diffusion region pattern 300b. It is also noteworthy that a plurality of spacing S is formed at two respective sides of the fin patterns 410 as shown in FIG. 5. The fin patterns 410 and the spacings S draw a drawn width Wd. More important, the drawn width Wd is defined by the abovementioned equation.

Please still refer to FIG. 5. As mentioned above, the first fin length $L_1$ of the fin patterns 410 is a product of the first positive integer $P_m$ and a predetermined value. As mentioned above, the predetermined value can be any unit length defined by the operator. In the preferred embodiment, the predetermined value is the manufacture grid, that is, the minimal width imageable in a graphic software, but not limited to this. It is noteworthy that when the length X of the first side 302 of the diffusion region pattern 300b cannot be found in the look-up table according to the length X of, $X_3$ that is closest to but smaller than the length X of the first side 302 is chosen and thus the corresponding first positive integer $P_3$ is obtained. In the preferred embodiment, the first positive integer $P_3$ is 10. Consequently, the first fin length $L_1$ of the fin patterns 410 in the diffusion region pattern 300b is ten times of the predetermined value. It is observed that the first fin length $L_1$ is smaller than the length X of the first side 302 as shown in FIG. 5.

Please still refer to FIGS. 5 and 6. Next, a relationship between the first fin length $L_1$ of the fin patterns 410 and the length X of the first side 302 of the diffusion region pattern 300b is verified: when the first fin length $L_1$ of the fin patterns 410 is not equal to the length X of the first side 302 of the diffusion region pattern 300b, for example when the first fin length $L_1$ of the fin patterns 410 is smaller than the length X of the first side 302 of the diffusion region pattern 300b, an OPC method is performed. More important, the OPC method is performed to increase the first fin length $L_1$ to obtain a second fin length $L_2$, and the second fin length $L_2$ is equal to the length X of the first side 302 of the diffusion region pattern 300b.

Please still refer to FIG. 6. After performing the OPC method, the planar design to non-planar design conversion is completed, and the fin patterns 410 are outputted into a mask. Briefly speaking, in the case that when the length X of the first side 302 of the diffusion region patterns 300a-300c is not a positive integer multiple of the predetermined value, a first positive integer $P_m$ smaller than expected value can be obtained from the look-up table and the first fin length $L_1$, which is smaller than the length X of the first side 302 is obtained. Next, the OPC method is performed to adjust the first fin length $L_1$ to obtain the second fin length $L_2$, which is equal to the length X of the first side 302. The final fin patterns 410 with the second fin length $L_2$ is then formed and outputted into a mask. Thus the diffusion region pattern 300a-300c to fin patterns 410 conversion is completed.

According to the planar design to non-planar design conversion method 200 provided by the second preferred embodiment, the amount of the fin patterns 410 and the first fin length $L_1$ of the fin patterns 410 can be obtained by querying the look-up table according to the two sides of the diffusion region pattern 300b. And the OPC method is performed to adjust the first fin length $L_1$ to obtain the second fin length $L_2$ that is equal to the diffusion region pattern 300b. Next, the fin patterns 410 finished in the CAD tool can be outputted into a mask after obtaining the second fin length $L_2$. Accordingly, the planar semiconductor device design is converted into the non-planar semiconductor device design, more particularly, the diffusion regions of the planar semiconductor device design are precisely and efficaciously converted into the fin structures of the non-planar semiconductor device design by the planar design to non-planar design conversion method 200 provided the present invention.

Figure 7:
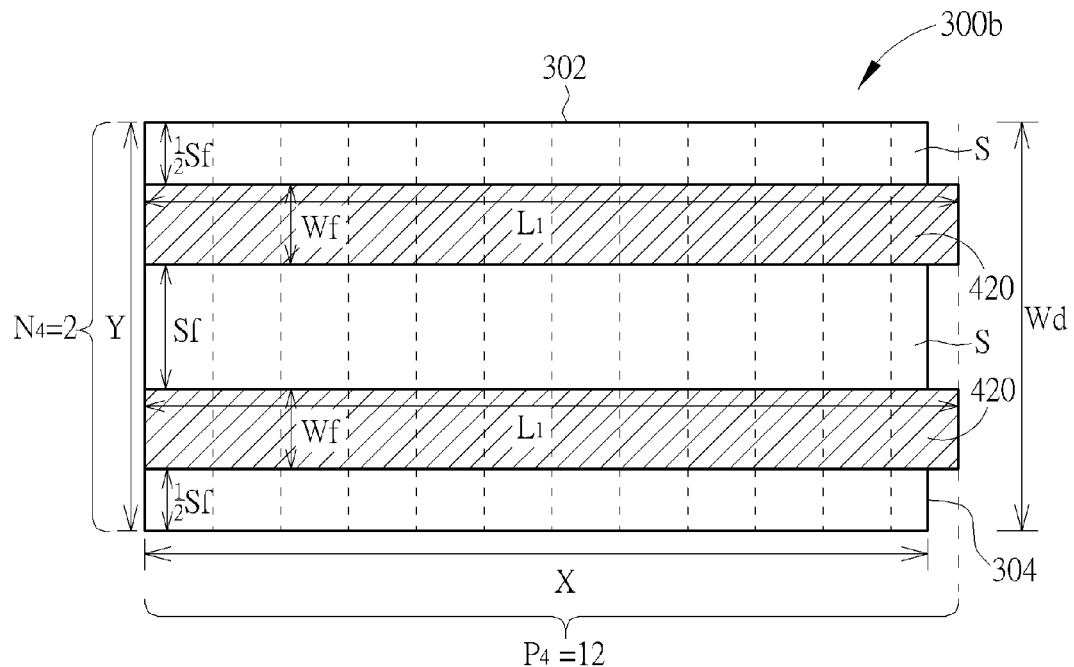
Figure 8:
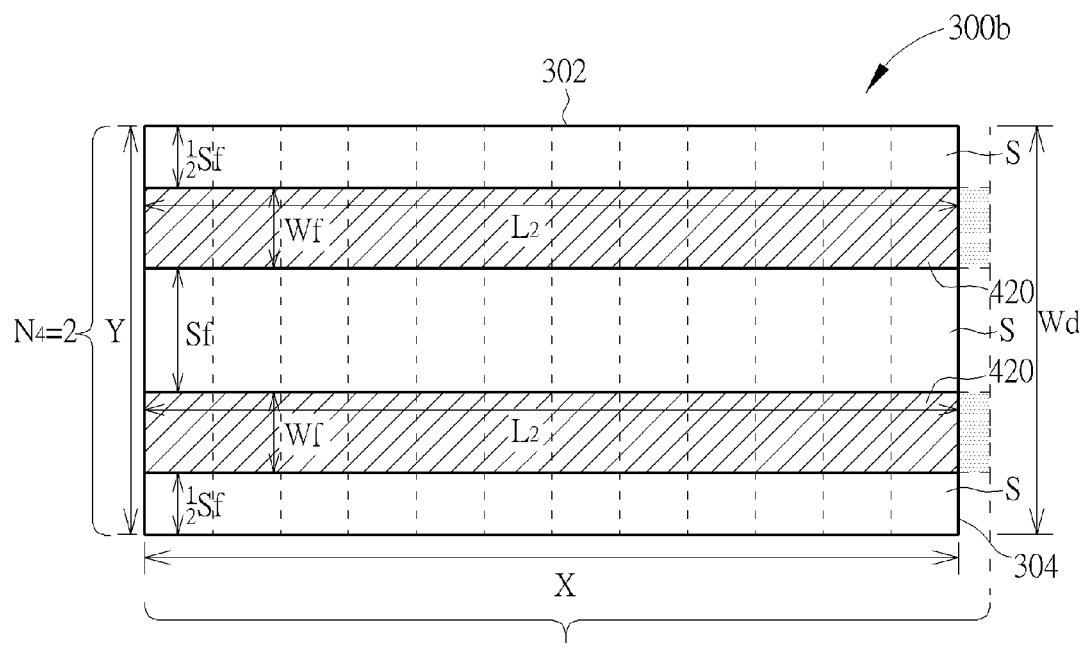

Please refer to FIGS. 3, 7 and 8, which are schematic drawings illustrating a planar design to non-planar design conversion method provided by a third preferred embodiment of the present invention. As shown in FIG. 3, Step 210 is performed to receive at least a diffusion region pattern 300a, 300b, and/or 300c. As mentioned above, the diffusion region patterns 300a-300c can include different shapes constructed by different blocks, but not limited to this. It is noteworthy that though the diffusion region pattern 300b is detailed as an embodiment of the planar design to non-planar design conversion method 200 provided by the preferred embodiment, those skilled in the art still can easily realize the embodiments involving the diffusion region pattern 300a and 300c according to the following description. As shown in FIG. 3, the diffusion region pattern 300b includes a quadrilateral shape, more particularly, a rectangle shape. The diffusion region pattern 300b includes a first side 302 and a second side 304. The side parallel with the X-direction is defined as the first side 302 while the side parallel with the Y-direction is defined as the second side 304. Or, the side perpendicular to a gate extending direction is defined as the first side 302 while the side parallel with the gate extending direction is defined as the second side 304. Consequently, the first side 302 and the second side 304 of the diffusion region pattern 300b are perpendicular to each other. Furthermore, the first side 302 includes a length X and the second side 304 includes a length Y.

Please refer to FIG. 7. Next, Step 220 is performed: querying a look-up table to obtain a first positive integer $P_m$ according to the first side 302 of the diffusion region pattern 300b and a second positive integer $N_n$ according to the second side 304 of the diffusion region pattern 300b. In detail, according to the length X of the first side 302 of the diffusion region pattern 300b, a first positive integer $P_m$ is obtained by querying the look-up table. Also, according to the length Y of the second side 304 of the diffusion region pattern 300b, a second positive integer $N_n$ is obtained by querying the look-up table. It is noteworthy that, in the case that the length X cannot be found from the look-up table, there is no positive integer corresponding to the length X of the first side 302 of the diffusion region pattern 300b can be directly obtained. Therefore, a length $X_4$ that is closest to but larger than the length X is chosen, and thus a first positive integer $P_4$ that is corresponding to $X_4$ is obtained. Also, a second positive integer $N_4$ is obtained by querying the look-up table according to the length Y of the second side 304 of the diffusion region pattern 300b.

After obtaining the first positive integer $P_4$ and the second positive integer $N_4$, Step 230 is performed: forming a plurality of fin patterns 420. As mentioned above, an amount of the fin patterns 420 is equal to the second positive integer $N_4$. As shown in FIG. 7, according to the length Y of the second side 304 of the diffusion region pattern 300b, the second positive integer $N_4$ is obtained from the look-up table. In the preferred embodiment, $N_4$ is 2. Consequently, two fin patterns 420 are formed in the diffusion region pattern 300b. It is also noteworthy that a plurality of spacing S is formed at two respective sides of the fin patterns 420 as shown in FIG. 7. The fin patterns 420 and the spacings S draw a drawn width Wd. More important, the drawn width Wd is defined by the abovementioned equation.

Please still refer to FIG. 7. The first fin length $L_1$ of the fin patterns 420 is a product of the first positive integer $P_4$ and a predetermined value. As mentioned above, the predetermined value can be any unit length defined by the operator. In the preferred embodiment, the predetermined value is the manufacture grid, that is, the minimal width imageable in a graphic software, but not limited to this. It is noteworthy that when the length X of the first side 302 of the diffusion region pattern 300b cannot be found in the look-up table according to the length X, $X_4$ that is closest to but larger than the length X of the first side 302 is chosen and thus the corresponding first positive integer $P_4$ is obtained. In the preferred embodiment, the first positive integer $P_4$ is 12. Consequently, the first fin length $L_1$ the fin patterns 420 in the diffusion region pattern 300b is twelve times of the predetermined value. It is observed that the first fin length $L_1$ is larger than the length X of the first side 302 as shown in FIG. 7.

Please still refer to FIGS. 7 and 8. Next, a relationship between the first fin length $L_1$ of the fin patterns 420 and the length X of the first side 302 of the diffusion region pattern 300b is verified: when the first fin length $L_1$ of the fin patterns 420 is not equal to from the length X of the first side 302 of the diffusion region pattern 300b, for example when the first fin length $L_1$ of the fin patterns 420 is larger than the length X of the first side 302 of the diffusion region pattern 300b, an OPC method is performed. More important, the OPC method is performed to decrease the first fin length $L_1$ to obtain a second fin length $L_2$, and the second fin length $L_2$ is equal to the length X of the first side 302 of the diffusion region pattern 300b.

Please still refer to FIG. 8. After performing the OPC method, the planar design to non-planar design conversion is completed, and the fin patterns 420 are outputted into a mask. Briefly speaking, in the case that when the length X of the first side 302 of the diffusion region patterns 300a-300c is not a positive integer multiple of the predetermined value, a first positive integer $P_m$ larger than expected value can be obtained from the look-up table, and the first fin length $L_1$, which is larger than the length X of the first side 302 is obtained. Next, the OPC method is performed to adjust the first fin length $L_1$ to obtain the second fin length $L_2$, which is equal to the length X of the first side 302. The final fin patterns 410 with the second fin length $L_2$ is then formed and outputted into a mask. Thus the diffusion region pattern 300a-300c to fin patterns 420 conversion is completed.

According to the planar design to non-planar design conversion method 200 provided by the third preferred embodiment, the amount of the fin patterns 420 and the first fin length $L_1$ of the fin patterns 420 can be obtained by querying the look-up table according to the two sides of the diffusion region pattern 300b. And the OPC method is performed to adjust the first fin length $L_1$ to obtain the second fin length $L_2$ that is equal to the diffusion region pattern 300b. Next, the fin patterns 420 finished in the CAD tool can be outputted into a mask after obtaining the second fin length $L_2$. Accordingly, the planar semiconductor device design is converted into the non-planar semiconductor device design, more particularly, the diffusion regions of the planar semiconductor device design are precisely and efficaciously converted into the fin structures of the non-planar semiconductor device design by the planar design to non-planar design conversion method 200 provided the present invention.

In summary, according to the planar design to non-planar design conversion method of the present invention, the look-up table is provided and queried to obtain the amount of the fin patterns and the first fin length of the fin patterns according to the lengths of the first side and the second side of the diffusion region pattern. Furthermore, the fin patterns can be formed in the CAD tool directly after obtaining the first fin length or after performing the OPC method. Accordingly, the planar design is efficaciously and precisely converted to the non-planar design by the planar design to non-planar design conversion method provided by the present invention. Particularly speaking, the diffusion regions of the planar design are converted to fin structures of the non-planar design by the planar design to non-planar design conversion method of the present invention. Consequently, process cost is reduced and the convertibility of planar design to non-planar design is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A planar design to non-planar design conversion method, comprising:
   receiving at least a diffusion region pattern, the diffusion region pattern comprising a first side and a second side perpendicular to each other, wherein the receiving is performed by at least a computer system;
   querying a look-up table to obtain a first positive integer according to the first side of the diffusion region pattern and a second positive integer according to the second side of the diffusion region pattern, wherein the querying is performed by the computer system; and
   forming a plurality of fin patterns, an amount of the fin patterns is equal to the second positive integer, and the fin patterns respectively comprising a first fin length, wherein the first fin length is a product of the first positive integer and a predetermined value, wherein the forming is performed by at least a computer-aided design (CAD) tool, and the predetermined value is a minimal width in a graphic software.

2. The planar design to non-planar design conversion method according to claim 1, further comprising a plurality of spacing formed at two respective sides of the fin patterns, the fin patterns respectively comprise a fin width and the spacings respectively comprise a spacing width.

3. The planar design to non-planar design conversion method according to claim 2, wherein the fin patterns and the spacings draw a drawn width.

4. The planar design to non-planar design conversion method according to claim 3, wherein the drawn width is defined by an equation as below:

$$Wd=Nf*(Wf+Sf)$$

Wherein Wd denotes the drawn width, Nf denotes the amount of the fin patterns, Wf denotes the fin width, and Sf denotes the spacing width.

5. The planar design to non-planar design conversion method according to claim 1, further comprising outputting the fin patterns directly after forming the fin patterns when the first fin length is equal to a length of the first side of the diffusion region pattern.

6. The planar design to non-planar design conversion method according to claim 1, further comprising performing an optical proximity correction (OPC) method to the fin patterns to adjust the first fin length when the first fin length is not equal to a length of the first side of the diffusion region pattern.

7. The planar design to non-planar design conversion method according to claim 6, wherein the first fin length is larger than the length of the first side of the diffusion region pattern.

8. The planar design to non-planar design conversion method according to claim 7, wherein the OPC method is performed to decrease the first fin length to obtain a second fin length, and the second fin length is equal to the length of the first side of the diffusion region pattern.

9. The planar design to non-planar design conversion method according to claim 8, further comprising outputting the fin patterns after performing the OPC method.

10. The planar design to non-planar design conversion method according to claim 6, wherein the first fin length is smaller than the length of the first side of the diffusion region pattern.

11. The planar design to non-planar design conversion method according to claim 10, wherein the OPC method is performed to increase the first fin length to obtain a second fin length, and the second fin length is equal to the length of the first side of the diffusion region pattern.

12. The planar design to non-planar design conversion method according to claim 11, further comprising outputting the fin patterns after performing the OPC method.

13. The planar design to non-planar design conversion method according to claim 1, further comprising dividing the diffusion region pattern into a plurality of sub-region patterns, and the sub-region patterns respectively comprise the first side and the second side.

14. The planar design to non-planar design conversion method according to claim 13, wherein the sub-region patterns physically contact each other.

* * * * *